(12) United States Patent
Ryu et al.

(10) Patent No.: US 11,710,891 B2
(45) Date of Patent: Jul. 25, 2023

(54) ANTENNA STRUCTURE AND DISPLAY DEVICE INCLUDING THE SAME

(71) Applicant: DONGWOO FINE-CHEM CO., LTD., Jeollabuk-do (KR)

(72) Inventors: Han Sub Ryu, Gyeongsangbuk-do (KR); Na Yeon Kim, Seoul (KR); Byung Jin Choi, Incheon (KR)

(73) Assignee: DONGWOO FINE-CHEM CO., LTD., Jeollabuk-Do (KR)

( * ) Notice: Subject to any disclaimer, the term of this patent is extended or adjusted under 35 U.S.C. 154(b) by 25 days.

(21) Appl. No.: 17/568,198

(22) Filed: Jan. 4, 2022

(65) Prior Publication Data
US 2022/0216596 A1 Jul. 7, 2022

(30) Foreign Application Priority Data

Jan. 6, 2021 (KR) .................... 10-2021-0001375

(51) Int. Cl.
*H01Q 1/24* (2006.01)
*H01Q 9/04* (2006.01)
*H05K 1/02* (2006.01)
*H01Q 21/08* (2006.01)

(52) U.S. Cl.
CPC ........... *H01Q 1/243* (2013.01); *H01Q 9/0407* (2013.01); *H01Q 21/08* (2013.01); *H05K 1/0243* (2013.01); *H05K 1/0277* (2013.01); *H05K 2201/10098* (2013.01)

(58) Field of Classification Search
CPC ....... H01Q 21/08; H01Q 9/0407; H01Q 1/243
See application file for complete search history.

(56) References Cited

FOREIGN PATENT DOCUMENTS

KR   10-2013-0095451 A   8/2013

*Primary Examiner* — Graham P Smith
(74) *Attorney, Agent, or Firm* — The PL Law Group, PLLC

(57) ABSTRACT

An antenna structure according to an embodiment of the present invention includes a dielectric layer, a radiator disposed on the dielectric layer, a transmission line branching from the radiator, a signal pad electrically connected to the radiator through the transmission line on the dielectric layer, and an external circuit structure bonded to the signal pad. The signal pad includes a bonding region that is bonded to the external circuit structure and a margin region that is not bonded to the external circuit structure and is adjacent to the bonding region. An area ratio of the margin region relative to the bonding region in the signal pad is 0.05 or more and less than 0.5.

18 Claims, 12 Drawing Sheets

ANTENNA STRUCTURE AND DISPLAY DEVICE INCLUDING THE SAME

CROSS-REFERENCE TO RELATED APPLICATION AND CLAIM OF PRIORITY

This application claims priority to Korean Patent Application No. 10-2021-0001375 filed on Jan. 6, 2021 in the Korean Intellectual Property Office (KIPO), the entire disclosures of which are incorporated by reference herein.

BACKGROUND

1. Field

The present invention relates to an antenna structure and a display device including the same. More particularly, the present invention relates to an antenna device including a dielectric layer, and a display device including the same.

2. Description of the Related Art

As information technologies have been developed, a wireless communication technology such as Wi-Fi, Bluetooth, etc., is combined with a display device in, e.g., a smartphone form. In this case, an antenna may be combined with the display device to provide a communication function.

As mobile communication technologies have been rapidly developed, an antenna capable of operating a high frequency or ultra-high frequency communication is needed in the display device.

Accordingly, developments of an antenna that may be inserted into the thin-type display device in the form of a film or a patch and may provide reliability of radiation properties even in the thin structure.

For example, when a feeding is performed to the antenna from a driving integrated circuit (IC) chip, an impedance mismatching of the antenna may occur due to a contact resistance between a pad included in the antenna and an external circuit structure or circuit wiring, and a radiation efficiency of the antenna may be degraded.

For example, Korean Published Patent Application No. 2013-0095451 discloses an antenna integrated to a display panel, which may not provide any solution for overcoming the issues.

SUMMARY

According to an aspect of the present invention, there is provided an antenna structure having improved signaling efficiency and reliability.

According to an aspect of the present invention, there is provided a display device including an antenna structure with improved signaling efficiency and reliability.

(1) An antenna structure, including: a dielectric layer; a radiator disposed on the dielectric layer; a transmission line branching from the radiator; a signal pad electrically connected to the radiator through the transmission line on the dielectric layer; and an external circuit structure bonded to the signal pad, wherein the signal pad includes a bonding region that is bonded to the external circuit structure and a margin region that is not bonded to the external circuit structure and is adjacent to the bonding region, and an area ratio of the margin region relative to the bonding region in the signal pad is 0.05 or more and less than 0.5.

(2) The antenna structure of the above (1), wherein the external circuit structure includes a flexible circuit board that includes a feeding wiring, and a conductive intermediate structure, and the conductive intermediate structure is attached on the bonding region of the signal pad, and the feeding wiring of the flexible circuit board is electrically connected to the signal pad through the conductive intermediate structure.

(3) The antenna structure of the above (2), wherein the margin region does not directly contact the conductive intermediate structure.

(4) The antenna structure of the above (2), further including a driving integrated circuit chip electrically connected to the flexible circuit board to supply a power to the radiator through the feeding wiring.

(5) The antenna structure of the above (4), wherein the radiator is driven at a frequency from 20 GHz to 40 GHz, and a power corresponding to a range of 40Ω to 70Ω is supplied to the radiator through the driving integrated circuit chip.

(6) The antenna structure of the above (1), wherein the area ratio of the margin region relative to the bonding region in the signal pad is from 0.1 to 0.3.

(7) The antenna structure of the above (1), further including a pair of ground pads spaced apart from the signal pad on the dielectric layer with the signal pad interposed therebetween.

(8) The antenna structure of the above (7), wherein each of the pair of the ground pads includes a ground bonding region bonded to the external circuit structure, and a ground margin region adjacent to the ground bonding region, and the ground margin region is not bonded to the external circuit structure.

(9) The antenna structure of the above (8), wherein an area ratio of the ground margin region relative to the ground bonding region is the same as the area ratio of the margin region to the bonding region in the signal pad.

(10) The antenna structure of the above (1), wherein the bonding region of the signal pad is directly connected to the transmission line.

(11) The antenna structure of the above (1), wherein the margin area of the signal pad is directly connected to the transmission line.

(12) The antenna structure of the above (1), wherein the margin region has a width greater than a width of the bonding region.

(13) The antenna structure of the above (1), wherein the margin region includes: a first portion extending in a length direction to be in contact with the bonding region; and a second portion extending in a width direction from an end of the first portion.

(14) The antenna structure of the above (1), wherein the transmission line includes a first transmission line and a second transmission line extending in different directions from the radiator, and the signal pad includes a first signal pad and a second signal pad electrically connected to the radiator through the first transmission line and the second transmission line, respectively.

(15) The antenna structure of the above (14), wherein the first signal pad includes a first bonding region that is bonded to the external circuit structure and a first margin region that is not bonded to the external circuit structure and is adjacent to the first bonding region, and an area ratio of the first margin region relative to the first bonding region in the first signal pad is 0.05 or more and less than 0.5, wherein the second signal pad includes a second bonding region that is bonded to the external circuit structure and a second margin region that is not bonded to the external circuit structure and is adjacent to the second bonding region, and an area ratio of the second margin region relative to the second bonding region in the second signal pad is 0.05 or more and less than 0.5.

(16) The antenna structure of the above (15), wherein the area ratio of the first margin region relative to the first bonding region is the same as the area ratio of the second margin region relative to the second bonding region.

(17) The antenna structure of the above (14), wherein the first transmission line and the second transmission line are symmetrical to each other with respect to a central line of the radiator.

(18) A display device including the antenna structure according to embodiments as described above.

In an antenna structure according to exemplary embodiments of the present invention, a signal pad electrically connected to a radiator may include a bonding region bonded to an external circuit structure and a margin region that may not be directly bonded to the external circuit structure, and an area ratio of the margin region relative to the bonding region may be 0.05 or more and less than 0.5

An adhesion region that may be bonded with the external circuit structure including a different material may be partially allocated, and the area ratio between the bonding region and the margin region may be maintained within the above range, so that an impedance through the signal pad may be maintained in a desired range.

Additionally, a radiation amount directed to the external circuit structure may be suppressed by adjusting the area of the bonding region, and an amount of power or radio wave supplied to the radiator through may be increased through the margin region.

In some embodiments, the radiator may be electrically connected to a first signal pad and a second signal pad independently supplying an input signal, and the first signal pad and the second signal pad may each have a bonding region and a margin region.

Accordingly, a single radiator may implement a plurality of polarization properties, and a first input signal and a second input signal may be alternately supplied, so that a horizontal polarization property and a vertical polarization property may be implemented together through one radiator.

In some embodiments, at least a portion of the radiator may be formed in a mesh structure to improve a transmittance of the antenna structure. For example, the antenna structure may be applied to a display device including a mobile communication device for a high frequency or ultra-high frequency band of 3G, 4G, 5G or higher, thereby improving optical properties such as transmittance and radiation properties.

DETAILED DESCRIPTION OF THE EMBODIMENTS

According to exemplary embodiments of the present invention, there is provided an antenna structure including a dielectric layer and an antenna unit a radiator and a signal pad that may include a bonding region and a margin region.

The antenna structure may be, e.g., a microstrip patch antenna fabricated in the form of a transparent film. The antenna structure may be applied to communication devices for a mobile communication of a high or ultrahigh frequency band corresponding to a mobile communication of, e.g., 3G, 4G, 5G or more.

According to exemplary embodiments of the present invention, there is also provided a display device including the antenna structure. An application of the antenna structure is not limited to the display device, and the antenna structure may be applied to various objects or structures such as a vehicle, a home electronic appliance, an architecture, etc.

Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

In the accompanying drawings, two directions parallel to, e.g., a top surface of a dielectric layer 110 to intersect each other are defined as a first direction and a second direction. For example, the first direction and the second direction may be perpendicular to each other. A direction vertical to the top surface of the dielectric layer 110 is defined as a third direction. For example, the first direction may correspond to a length direction of the antenna structure, the second direction may correspond to a width direction of the antenna structure, and the third direction may correspond to a thickness direction of the antenna structure. The definition of the directions may be equally applied to the all accompanying drawings.

Figure 1:
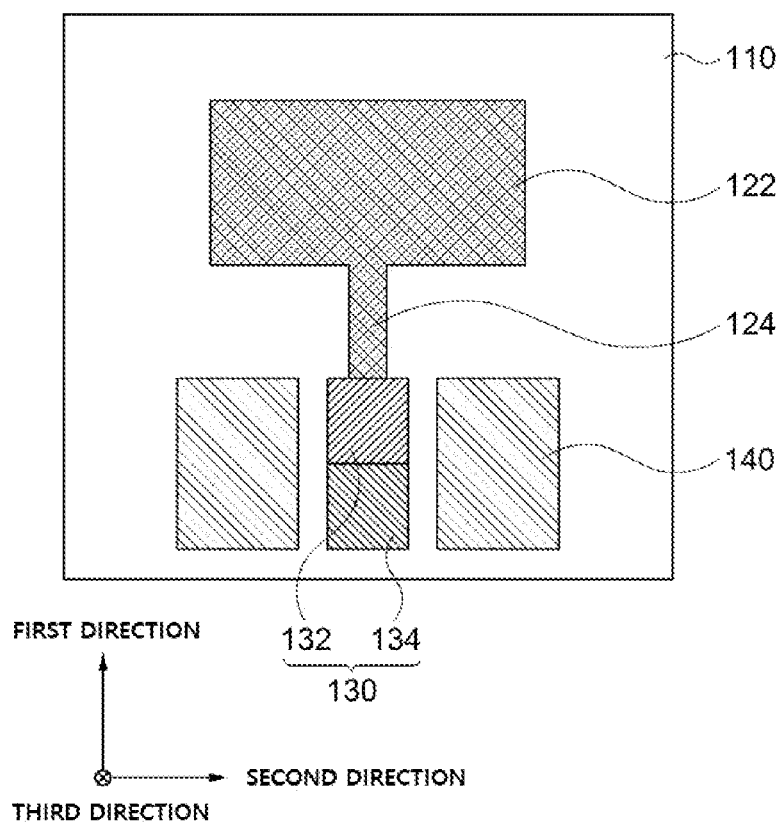
FIG. 1 is a schematic top planar view and illustrating an antenna structure in accordance with exemplary embodiments.

FIG. 1 is a schematic top planar view and illustrating an antenna structure in accordance with exemplary embodiments.

Referring to FIG. 1, the antenna structure may include a dielectric layer 110 and an antenna unit disposed on the dielectric layer 110. The antenna unit may include a radiator 122 and a signal pad 130 electrically connected to the radiator 122. The radiator 122 and the signal pad 130 may be electrically connected to each other through a transmission line 124.

The dielectric layer 110 may include a polyester-based resin such as polyethylene terephthalate, polyethylene isophthalate, polyethylene naphthalate and polybutylene terephthalate; a cellulose-based resin such as diacetyl cellulose and triacetyl cellulose; a polycarbonate-based resin; an acrylic resin such as polymethyl (meth)acrylate and polyethyl (meth)acrylate; a styrene-based resin such as polystyrene and an acrylonitrile-styrene copolymer; a polyolefin-based resin such as polyethylene, polypropylene, a cycloolefin or polyolefin having a norbornene structure and an ethylene-propylene copolymer; a vinyl chloride-based resin; an amide-based resin such as nylon and an aromatic polyamide; an imide-based resin; a polyethersulfone-based resin; a sulfone-based resin; a polyether ether ketone-based resin; a polyphenylene sulfide resin; a vinyl alcohol-based resin; a vinylidene chloride-based resin; a vinyl butyral-based resin; an allylate-based resin; a polyoxymethylene-based resin; an epoxy-based resin; a urethane or acrylic urethane-based resin; a silicone-based resin, etc. These may be used alone or in a combination thereof.

An adhesive film such as an optically clear adhesive (OCA), an optically clear resin (OCR), or the like may be included in the dielectric layer 110. In an embodiment, the dielectric layer 110 may include an inorganic insulating material such as glass, silicon oxide, silicon nitride, silicon oxynitride, etc.

In an embodiment, the dielectric layer 110 may be provided as a substantially single layer. In an embodiment, the dielectric layer 110 may have a multi-layered structure of at least two layers.

Capacitance or inductance may be generated between the antenna unit and/or an antenna ground layer 160 (see FIG. 2) by the dielectric layer 110, so that a frequency band at which the antenna structure may be driven or operated may be adjusted. In some embodiments, a dielectric constant of the dielectric layer 110 may be adjusted in a range from about 1.5 to about 12. When the dielectric constant exceeds about 12, a driving frequency may be excessively decreased, so that driving in a desired high frequency band may not be implemented.

As described above, the antenna unit may include the radiator 122 and the signal pad 130, and the radiator 122 and the signal pad 130 may be electrically connected through the transmission line 124.

For example, the transmission line 124 may be branched from a central portion of the radiator 122 to be connected to the signal pad 130. In an embodiment, the transmission line 124 may be provided as a single member substantially integrally connected with the radiator 122. In an embodiment, the transmission line 124 may also be provided as a single member substantially integrally connected to the signal pad 130.

The signal pad 130 may receive and transmit a power from an external circuit structure to the radiator 122. In exemplary embodiments, the signal pad 130 may include a bonding region 132 and a margin region 134.

The bonding region 132 may be a region directly attached or bonded to the external circuit structure. For example, the external circuit structure may include a flexible circuit board (FPCB) 200 and a conductive intermediate structure 150 as will be described later with reference to FIG. 2.

The margin region 134 may be a region that may not be directly attached or bonded to the external circuit structure. The margin region 134 may include a remaining portion of the signal pad 130 except for the bonding region 132.

Figure 2:
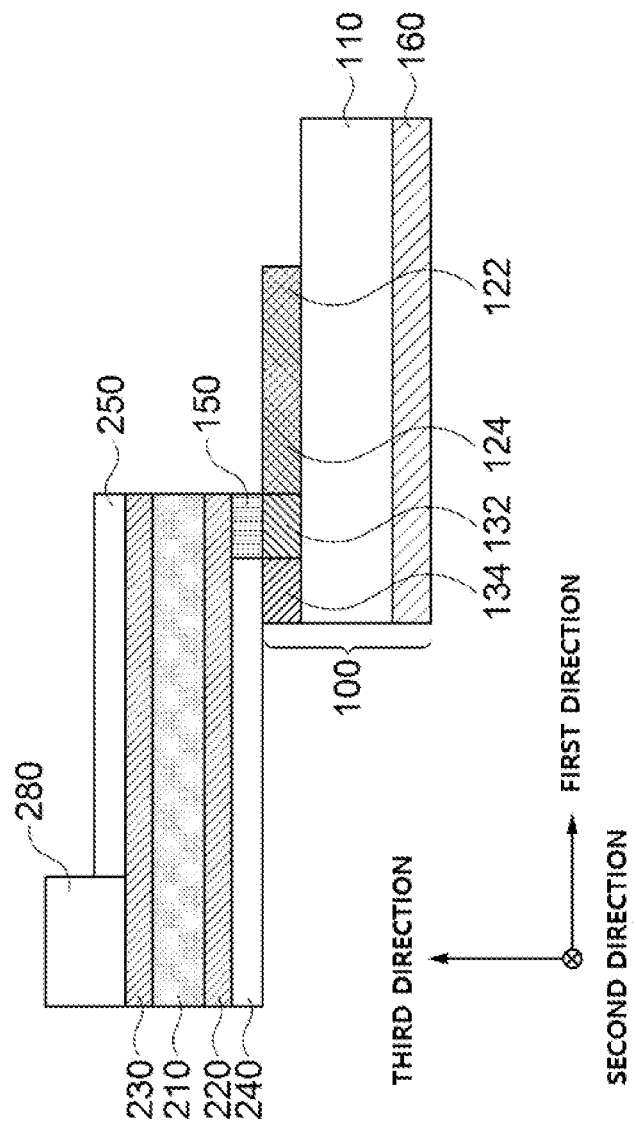
FIG. 2 is a schematic cross-sectional view and illustrating an antenna structure in accordance with exemplary embodiments.

For example, while implementing high-frequency communication in a frequency range from about 20 GHz to 40 GHz, a resistance or impedance may be set from about 40Ω to 70Ω, preferably from about 50Ω to 60Ω, more preferably around 50Ω for a resonance without a signal reflection through the driving IC chip 280 (see FIG. 2).

As illustrated in FIG. 1, the bonding region 132 of the signal pad 130 may be adjacent to the transmission line 124. In this case, a signal transmission path between the external circuit structure and the radiator 122 may be shortened. For example, a front end portion of the signal pad 130 in the first direction may correspond to the bonding region 132, and a rear end portion in the first direction may correspond to the margin region 134.

In exemplary embodiments, an area ratio of the margin region 134 relative to the bonding region 132 may be in a range from about 0.05 or more and less than 0.5. Preferably, the area ratio of the margin region 134 relative to the bonding region 132 may be in a range of about 0.1 to 0.3.

If the area ratio of the margin region 134 relative to the bonding region 132 is less than 0.05, the impedance value set through the antenna unit may be changed or disturbed by a contact resistance between the external circuit structure and the signal pad 130 to result in a impedance mismatch. If the area ratio of the margin region 134 relative to the bonding region 132 is 0.5 or more, sufficient radiation efficiency and antenna gain may not be obtained and the impedance mismatch may be further increased.

The impedance mismatch that may occur in the bonding region 132 may be suppressed or buffered while maintaining a desired impedance through the margin region 134 within the range of the area ratio of the margin region 134 relative to the bonding region 132.

Additionally, a sufficient amount of radiation and power directed to the radiator 122 may be achieved through the margin region 134. Thus, even when the area of the signal pad 130 is increased, sufficient radiation efficiency and antenna gain may be achieved while suppressing the impedance mismatching.

The antenna unit may further include a ground pad 140. The ground pad 140 may be disposed around the signal pad 130 to be electrically and physically separated from the signal pad 130. For example, a pair of the ground pads 140 may be disposed to face each other in the second direction with the signal pad 130 interposed therebetween.

The ground pad 140 may be disposed at the same layer or the same level as that of the antenna unit (e.g., on the top surface of the dielectric layer 110). In this case, a horizontal radiation property may be added from the antenna structure. As will be described later with reference to FIG. 2, the antenna structure may further include the antenna ground layer 160 on a bottom surface of the dielectric layer 110. In this case, a vertical radiation property may be implemented from the antenna structure.

As illustrated in FIG. 1, a length (a length in the first direction) of the ground pad 140 may cover both the bonding region 132 and the margin region 134. For example, the length of the ground pad 140 may be equal to or greater than an entire length of the signal pad 130.

The antenna unit may include silver (Ag), gold (Au), copper (Cu), aluminum (Al), platinum (Pt), palladium (Pd), chromium (Cr), titanium (Ti), tungsten (W), and niobium. (Nb), tantalum (Ta), vanadium (V), iron (Fe), manganese (Mn), cobalt (Co), nickel (Ni), zinc (Zn), tin (Sn), molybdenum (Mo), calcium (Ca) or an alloy containing at least one of the metals. These may be used alone or in combination of two or more therefrom.

In an embodiment, the antenna unit may include silver (Ag) or a silver alloy (e.g., silver-palladium-copper (APC)), or copper (Cu) or a copper alloy (e.g., a copper-calcium (CuCa)) to implement a low resistance and a fine line width pattern.

The antenna unit may include a transparent conductive oxide such indium tin oxide (ITO), indium zinc oxide (IZO), zinc oxide (ZnOx), indium zinc tin oxide (IZTO), etc.

In some embodiments, the antenna unit may include a stacked structure of a transparent conductive oxide layer and a metal layer. For example, the first and second antenna patterns 110 and 120 may include a double-layered structure of a transparent conductive oxide layer-metal layer, or a triple-layered structure of a transparent conductive oxide layer-metal layer-transparent conductive oxide layer. In this case, flexible property may be improved by the metal layer, and a signal transmission speed may also be improved by a low resistance of the metal layer. Corrosive resistance and transparency may be improved by the transparent conductive oxide layer.

The antenna unit may include a blackened portion, so that a reflectance at a surface of the antenna unit may be decreased to suppress a visual recognition of the antenna unit due to a light reflectance.

In an embodiment, a surface of the metal layer included in the antenna unit may be converted into a metal oxide or a metal sulfide to form a blackened layer. In an embodiment, a blackened layer such as a black material coating layer or a plating layer may be formed on the antenna unit or the metal layer. The black material or plating layer may include silicon, carbon, copper, molybdenum, tin, chromium, molybdenum, nickel, cobalt, or an oxide, sulfide or alloy containing at least one therefrom.

A composition and a thickness of the blackened layer may be adjusted in consideration of a reflectance reduction effect and an antenna radiation property.

In some embodiments, the radiator 122 may include a mesh structure. In this case, transmittance of the radiator 122 may be improved, and a visual recognition of the radiator 122 may be prevented to a user when the antenna structure is employed to a display device. In an embodiment, the transmission line 124 may also be patterned together with the radiator 122 to include the mesh structure.

In some embodiments, while employing the mesh structure, electrode lines included in the mesh structure may be formed of a low-resistance metal such as copper, silver, an APC alloy, or a CuCa alloy, thereby suppressing a resistance increase. Accordingly, a low-resistance and high-sensitivity transparent antenna device may be effectively implemented In some embodiments, the signal pad 130 may have a solid structure. Accordingly, a contact resistance between the bonding region 132 and the external circuit structure may be reduced to increase an efficiency of radio wave and power transmission to the radiator 122 through the margin region 134. In an embodiment, the ground pad 140 may also have the solid structure to improve a noise absorption efficiency.

FIG. 2 is a schematic cross-sectional view and illustrating an antenna structure in accordance with exemplary embodiments.

Referring to FIG. 2, the antenna structure may include an antenna device 100 and a flexible circuit board (FPCB) 200.

In some embodiments, the driving integrated circuit (IC) chip 280 electrically connected to the antenna device 100 through the flexible circuit board 200 may be provided on an upper portion of the flexible circuit board 200 by a surface mounting technology (SMT).

For example, a circuit or a contact electrically connecting the driving integrated circuit chip 280 and a feeding wiring with each other may be formed in the flexible circuit board 200. The driving integrated circuit chip 280 may be disposed on the flexible circuit board 200, so that a signal transmission/reception path may be shortened and a signal loss may be suppressed.

In some embodiments, the flexible circuit board 200 may be electrically connected to an intermediate circuit board (not illustrated), and the driving integrated circuit chip 280 may be mounted on the intermediate circuit board.

In this case, a feeding and a driving signal may be applied from the driving integrated circuit chip 280 to the antenna unit through a feeding wiring 220 to be described later. For example, a circuit or a contact electrically connecting the driving integrated circuit chip 280 and the feeding wiring 220 may be further included in the intermediate circuit board.

For example, the intermediate circuit board may include a main board of an image display device, a rigid printed circuit board, various antenna package boards, etc. For example, if the intermediate circuit board is a rigid printed circuit board, the intermediate circuit board may include a core layer formed of a resin impregnated with an inorganic material such as glass fiber (e.g., a prepreg) and intermediate circuits formed in the core layer.

In some embodiments, the flexible circuit board 200 and an intermediate circuit board may be coupled to each other through a connector.

As described with reference to FIG. 1, the antenna device 100 may include a dielectric layer 110 and an antenna unit disposed on the top surface of the dielectric layer 110. For example, the antenna device 100 may be provided as a patch antenna or a film antenna.

The antenna unit may include the radiator 122, the transmission line 124 and the signal pad 130, and the signal pad 130 may include the bonding region 132 and the margin region 134. The ground pad 140 spaced apart from the signal pad 130 may be further disposed around the signal pad 130.

In some embodiments, the antenna ground layer 160 may be formed on the bottom surface of the dielectric layer 110. The antenna ground layer 160 may entirely cover the antenna unit in a planar view.

In an embodiment, a conductive member of a display device or a display panel in which the antenna structure is disposed may serve as the antenna ground layer 160.

For example, the conductive member may include electrodes or wires such as a gate electrode, a source/drain electrode, a pixel electrode, a common electrode, a data line and a scan line included in a thin film transistor (TFT) array panel.

In an embodiment, various structures including a conductive material disposed under the display panel may serve as the antenna ground layer 160. For example, a metal plate (e.g., a stainless-steel plate such as a SUS plate), a pressure sensor, a fingerprint sensor, an electromagnetic wave shielding layer, a heat dissipation sheet, a digitizer, etc., may serve as the antenna ground layer 160.

The flexible circuit board 200 may be disposed on the antenna unit to be electrically connected to the antenna element 100. The flexible circuit board 200 may include a core layer 210, a feeding wiring 220 and a feeding ground 230. An upper coverlay film 250 and a lower coverlay film 240 for protecting wirings may be formed on the upper and lower surfaces of the core layer 210, respectively.

The core layer 210 may include, e.g., a resin material having flexibility such as polyimide, an epoxy resin, polyester, a cycloolefin polymer (COP), a liquid crystal polymer (LCP), or the like.

The feeding wiring 220 may be disposed on the bottom surface of the core layer 210. The feeding wiring 220 may serve as a wiring for distributing power from the driving integrated circuit (IC) chip 280 to the antenna unit or the radiator 122.

In exemplary embodiments, the feeding wiring 220 may be electrically connected to the signal pad 130 of the antenna unit through the conductive intermediate structure 150.

The conductive intermediate structure 150 may be obtained from, e.g., an anisotropic conductive film (ACF). In this case, the conductive intermediate structure 150 may include conductive particles (e.g., silver particles, copper particles, carbon particles, etc.) dispersed in a resin layer.

As described with reference to FIG. 1, the conductive intermediate structure 150 may be selectively bonded to or in contact with the bonding region 132 included in the signal pad 130, and the margin region 134 of the signal pad 130 may remain as a non-bonding region with the conductive intermediate structure 150.

As described above, the conductive intermediate structure 150 may include a material different from the material included in the signal pad 130 such as the resin material and the conductive particles to cause an impedance mismatch in the antenna unit. However, the impedance mismatch may be buffered or suppressed by allocating the margin region 134 that may not be bonded to the conductive intermediate structure 150.

For example, the lower coverlay film 240 may be partially cut or removed to expose a portion of the feeding wiring 220 having a size corresponding to the bonding region 132. The exposed portion of the feeding wiring 220 and the bonding region 132 may be pressed and bonded to each other through the conductive intermediate structure 150.

In some embodiments, the lower coverlay film 240 may be disposed on the margin region 134. In some embodiments, the margin region 134 may additionally provide an alignment margin in the bonding process between the flexible circuit board 200 and the conductive intermediate structure 150. Accordingly, an additional bonding margin may be provided by the margin area 134 when a misalignment occurs on the bonding area 132.

A feeding ground 230 may be disposed on the upper surface of the core layer 210. The feeding ground 230 may have a line shape or a plate shape. The feeding ground 230 may function as a barrier to shield or suppress a noise or a self-radiation generated from the feeding wiring 220.

The feeding wiring 220 and the feeding ground 230 may include the metal and/or the alloy as mentioned in the antenna unit.

In some embodiments, the feed ground 230 may be electrically connected to the ground pad 140 (refer to FIG. 1) of the antenna pattern through a ground contact (not shown) penetrating the core layer 210.

The driving IC chip 280 may be disposed on the flexible circuit board 200 or the intermediate circuit board. Power may be supplied from the driving IC chip 280 to the antenna unit through the feeding wiring 220. For example, the flexible circuit board 200 may further include a circuit or a contact electrically connecting the driving IC chip 280 and the feeding wiring 220 to each other.

FIGS. 3 to 10 are schematic top planar views illustrating antenna structures in accordance with some exemplary embodiments. Detailed descriptions on structures and elements substantially the same as or similar to those described with reference to FIG. 1 will be omitted herein.

Figure 3:
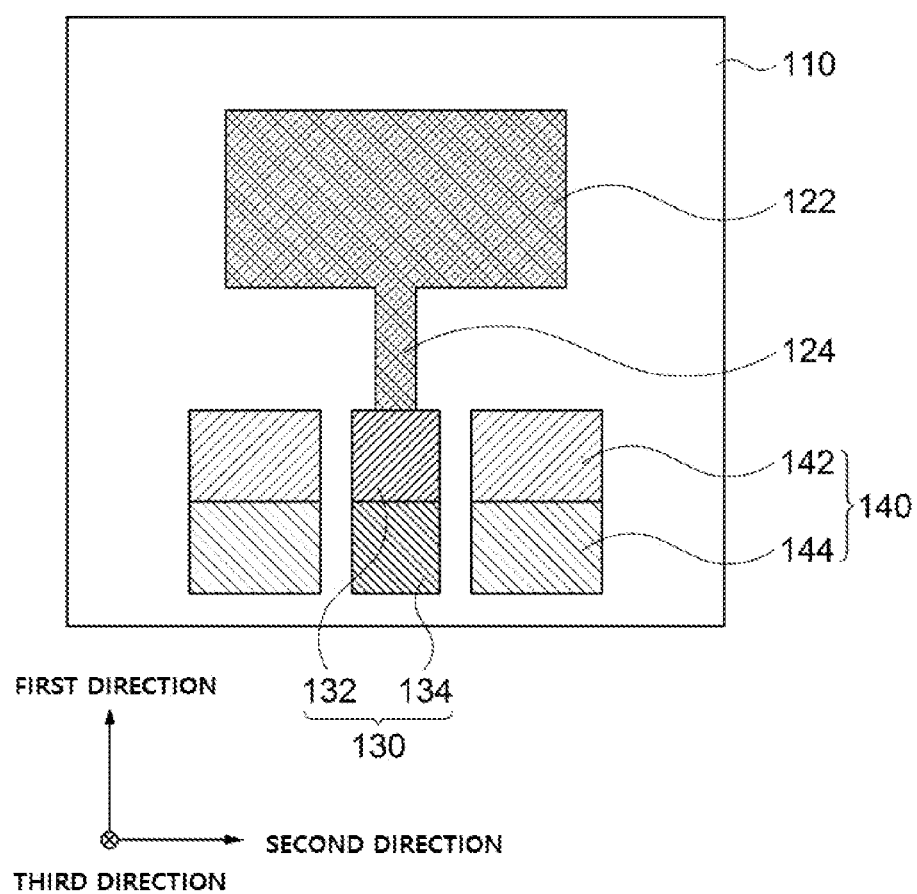
FIGS. 3 to 10 are schematic top planar views illustrating antenna structures in accordance with some exemplary embodiments.

Referring to FIG. 3, the ground pad 140 may include a ground bonding region 142 and a ground margin region 144.

The ground bonding region 142 may be a region directly bonded or bonded to the external circuit structure. For example, the ground bonding region 142 may be formed to have the same length as that of the bonding region 132 of the signal pad 130.

The ground margin region 144 may be a region that may not be directly attached or bonded to the external circuit structure. The ground margin region 144 may include a remaining portion of the ground pad 140 except for the ground bonding region 142.

In some embodiments, an area ratio of the ground margin region 144 relative to the ground bonding region 142 may be substantially the same as the area ratio of the margin region 134 relative to the bonding region 132.

In this case, a separate alignment may not be performed for the bonding process with the flexible circuit board 200 through the conductive intermediate structure 150, and a process convenience may be improved.

Figure 4:
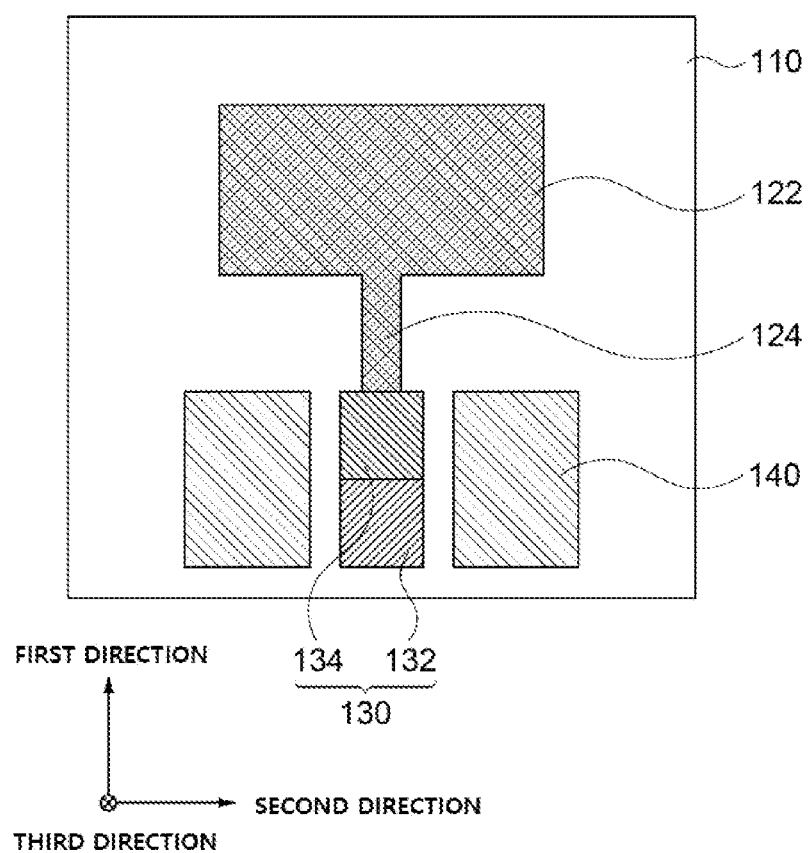

Referring to FIG. 4, the margin region 134 of the signal pad 130 may be disposed to be closer to the transmission line 124. For example, a front end portion of the signal pad 130 in the first direction may serve as the margin region 134, and rear end portion in the first direction of the signal pad 130 may be allocated as the bonding region 132. In this case, the margin region 134 may be directly connected to the transmission line 124.

In the embodiment of FIG. 4, the margin region 134 may be disposed between the bonding region 132 and the transmission line 124, so that an impedance mismatch may be resolved before radio-wave or power is supplied to the radiator 122. Further, a directivity of radio-wave power to the radiator 122 may be improved.

Figure 5:
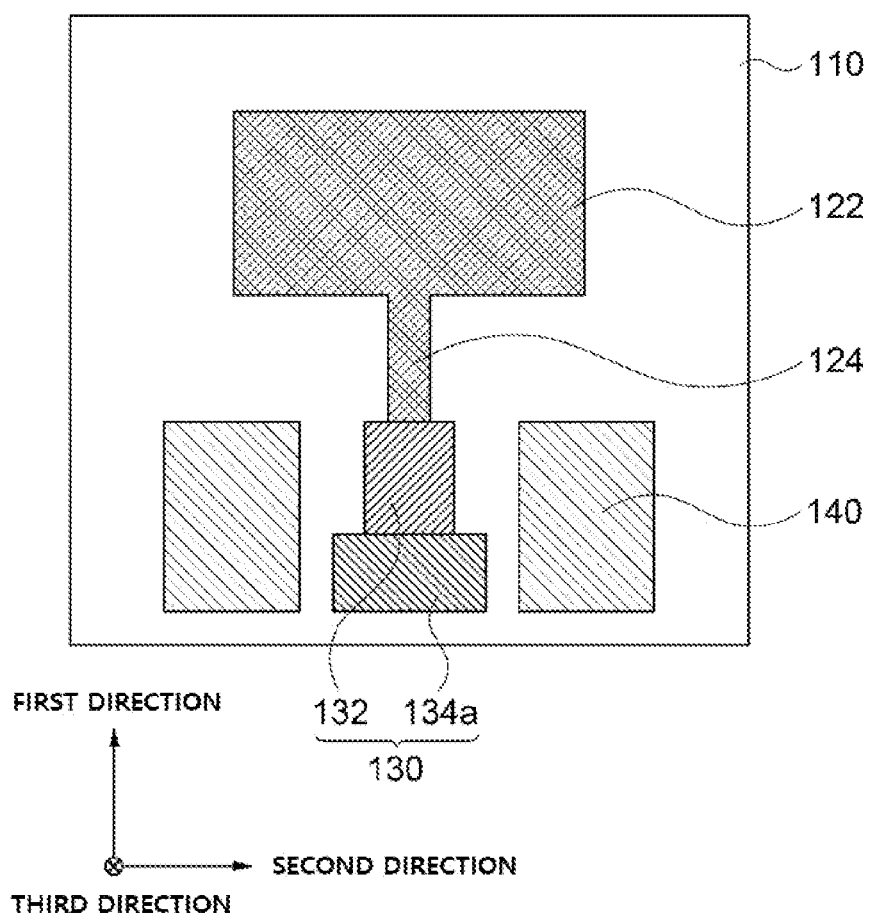

Referring to FIG. 5, the margin region 134a may have a width (e.g., a width in the second direction) greater than that of the bonding region 132. In this case, when misalignment of the flexible circuit board 200 or the conductive intermediate structure 150 to the bonding region 132 occurs, an additional alignment margin from the margin region 134a may be more effectively provided.

Additionally, a length of the margin region 134a may be relatively reduced, and an area occupied by the signal pad 130 may be reduced.

Figure 6:
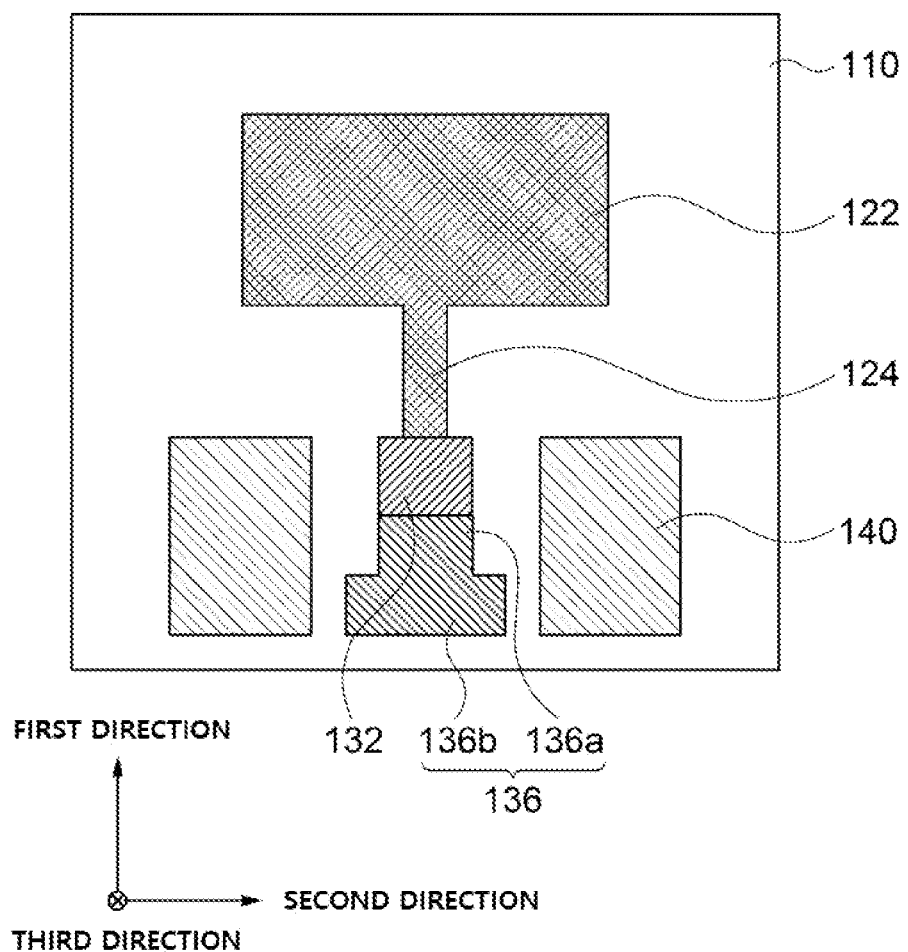

Referring to FIG. 6, the margin area 136 may include an extension in the width direction (e.g., the second direction).

For example, the margin region 136 may include a first portion 136a extending in the length direction (e.g., in the first direction) to be in contact with the bonding region 132, and a second portion 136b extending in the width direction from an end of the first portion 136a.

The impedance mismatch may be buffered or suppressed through the first portion 136a having a shape substantially similar to that of the bonding region 132, and a resistance of the signal pad 130 may be further reduced through the second portion 136b to improve a supply efficiency of radio-wave or power to the radiator 122.

Figure 7:
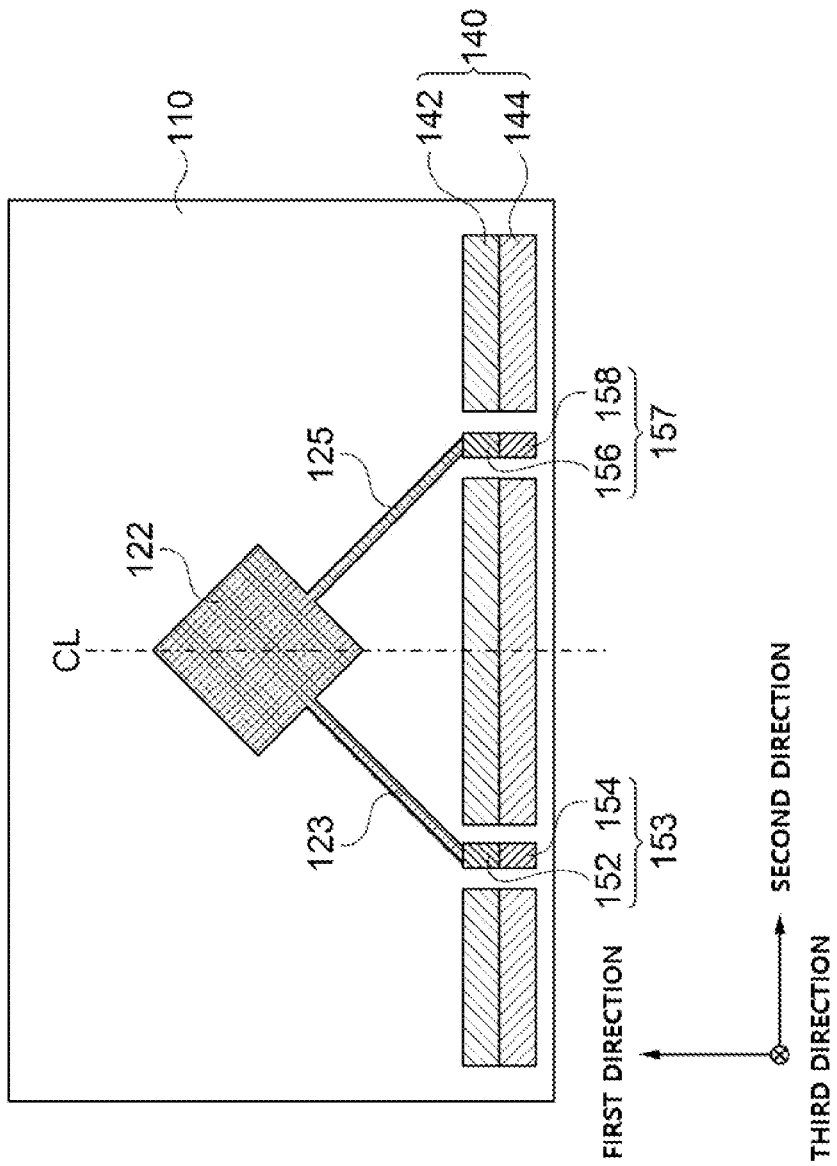

Referring to FIG. 7, the antenna unit may include the radiator 122, a first signal pad 153 and a second signal pad 157, and the radiator 122 may be electrically connected to the first signal pad 153 and the second signal pad 157 through a first transmission line 123 and a second transmission line 125, respectively.

For example, the first signal pad 153 and the second signal pad 157 may receive a power from the external circuit structure and transfer the power to the radiator 122.

In exemplary embodiments, the first signal pad 153 may include a first bonding region 152 and a first margin region 154, and the second signal pad 157 may include a second bonding region 156 and a second margin region 158.

The first bonding region 152 and the second bonding region 156 may be regions directly attached bonded to the external circuit structure, and may have substantially the same structure and function as those of the above-described bonding region 132.

The first margin region 154 and the second margin region 158 may be regions that are not directly attached or bonded to the external circuit structure. Accordingly, the first margin area 154 and the second margin area 158 may include remaining portions of the first signal pad 153 and the second signal pad 157 excluding the bonding regions. The first margin region 154 and the second margin region 158 may have substantially the same structure and function as those of the margin region 134 as described above.

The radiator 122 may receive signals from the first and second signal pads 153 and 157 in different directions. Thus, a plurality of polarization property (e.g., a dual polarization) may be implemented in one radiator.

In this case, the signal input to the radiator 122 may be distributed and supplied from the first and second signal pads 153 and 157, so that a total area of the first and second bonding regions 152 and 156 may be sufficiently obtained to stably provide signals.

Additionally, the area ratio of the bonding region and the margin region may be adjusted within the rang as described above, so that the impedance mismatch may be suppressed or buffered, and the antenna gain property may be also improved.

The radiator 122 may receive an input signal (an electrical signal) from each of the first signal pad 153 and the second signal pad 157 to radiate an electromagnetic wave signal. Further, the electromagnetic wave signal may be received and converted into the electrical signal based on a reciprocal property of the antenna, In some embodiments, the first transmission line 123 and the second transmission line 125 may be connected to two adjacent sides (two adjacent sides of a polygon in a planar view) of the radiator 122 having a polygonal shape. For example, the first transmission line 123 and the second transmission line 125 may be connected to centers of the two sides.

An imaginary line passing through a center of the radiator 122 and equally dividing the radiator 122 may be defined as a central line CL. As illustrated in FIG. 7, the central line CL may extend in the first direction.

In some embodiments, the first transmission line 123 and the second transmission line 125 may extend obliquely with respect to the central line CL of the radiator 122.

For example, if the radiator 122 has a rhombus shape as illustrated in FIG. 7, the first transmission line 123 and the second transmission line 125 may extend vertically to the adjacent two sides of the radiator 122. In this case, the first transmission line 123 and the second transmission line 125 may have the shortest lengths, and a transmission speed and an efficiency of the input signal may be improved.

In some embodiments, the first transmission line 123 and the second transmission line 125 may be symmetrical to each other. For example, the first transmission line 123 and the second transmission line 125 may be symmetrical with respect to the center or the central line CL of the radiator 122.

Figure 8:
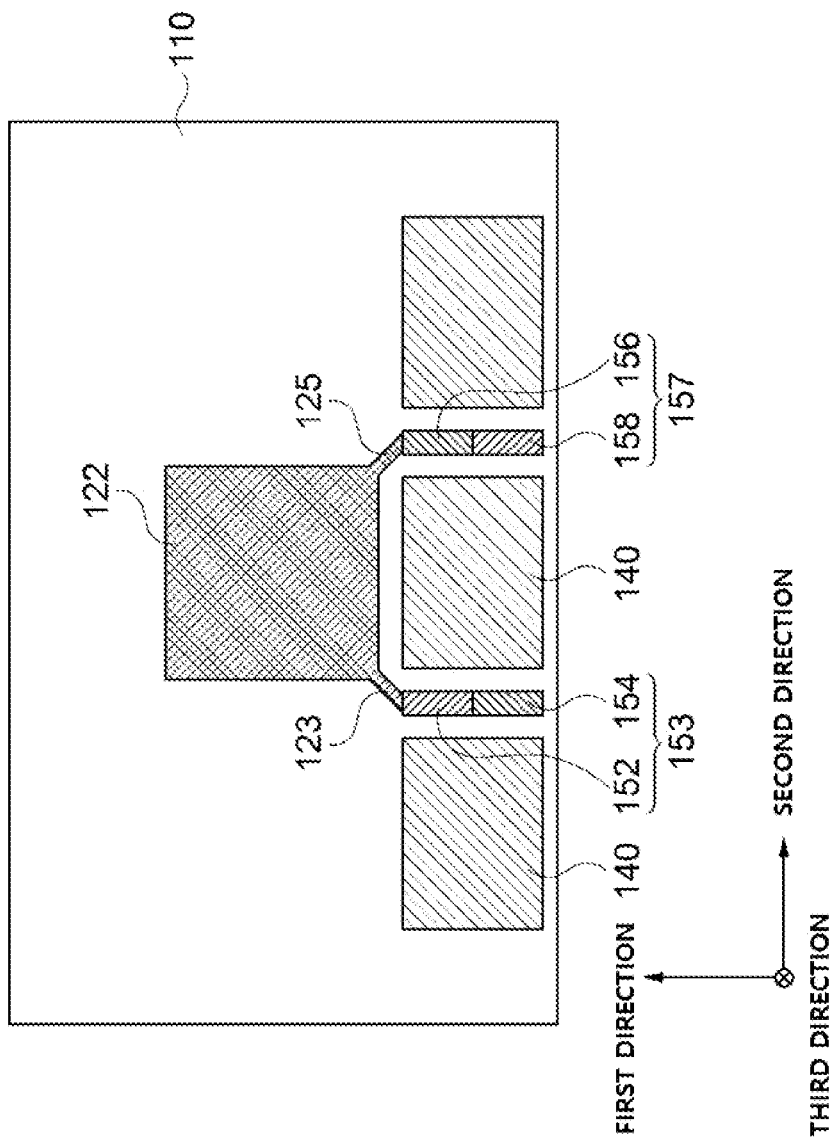

Referring to FIG. 8, the first transmission line 123 and the second transmission line 125 may extend along imaginary lines extending from the center of the radiator 122 to two adjacent vertices.

For example, the radiator 122 may have a quadrangular (e.g., rectangular or square) shape with one side parallel to the first direction. The quadrangle-shaped radiator 122 may include a first vertex and a second vertex adjacent to the first vertex in the second direction.

The first transmission line 123 may extend from the first vertex along an imaginary line connecting the first vertex and the center of the radiator 122. The second transmission line 125 may extend from the second vertex along an imaginary line connecting the second vertex and the center of the radiator 122.

In this case, signal transmission and reception, and feeding in different directions may be implemented through the first transmission line 123 and the second transmission line 125, so that a dual polarization property of the antenna may be effectively implemented.

Figure 9:
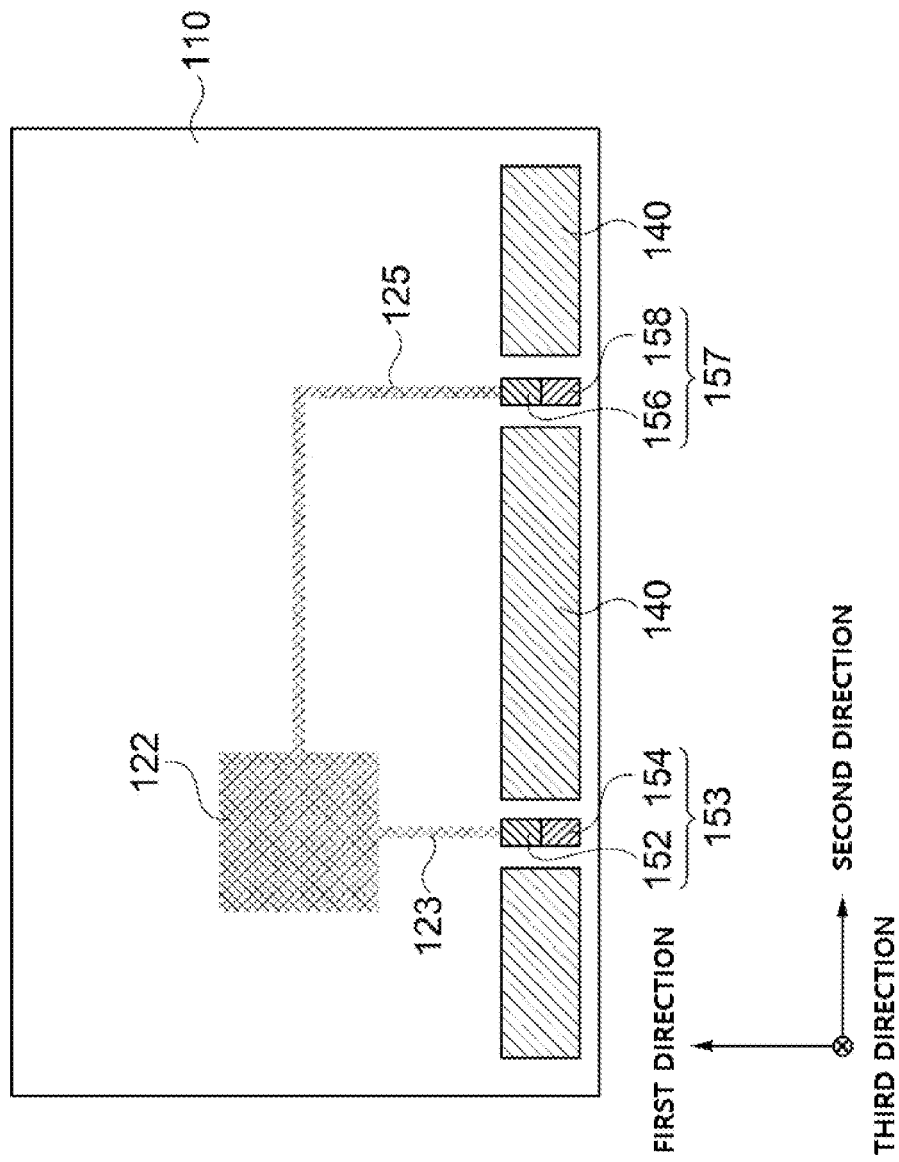

Referring to FIG. 9, at least one side of the radiator 122 may be parallel to a width direction (e.g., the second direction) of the antenna structure. For example, the radiation pattern 122 may have a square shape, and one side of the square-shape radiator 122 may be parallel to a width direction (e.g., the second direction) of the antenna structure.

In some embodiments, the first transmission line 123 and the second transmission line 125 may branch from two adjacent sides of the radiation pattern 122. The branched first transmission line 123 may be connected to the first signal pad 153 in a straight line, and the second transmission line 125 may be bent to be connected to the second signal pad 157.

Accordingly, a phase difference between the first input signal and the second input signal supplied to the radiator 122 through the first transmission line 123 and the second transmission line 125, respectively, may be controlled by the driving IC chip 280.

In some embodiments, the first signal pad 153 may supply the first input signal having a first phase to the radiator 122. The second signal pad 157 may supply the second input signal having a second phase.

In some embodiments, the first input signal and the second input signal may be alternately supplied. In this case, a vertical polarization property and a horizontal polarization property may be implemented from one radiator 122. For example, one of the vertical polarization property and the horizontal polarization property may be implemented through the radiator 122 when the first input signal is supplied, and the other one may be implemented when the second input signal is supplied.

In some embodiments, the phase of the first input signal may be different from the phase of the second input signal. The second input signal having the phase different from the phase of the first input signal may be supplied together to implement a circular polarization or elliptical polarization property. The first input signal and the second input signal having the phase difference may be supplied together to the radiator 122, and a plurality of polarization properties may be implemented through the radiator 122.

For example, the phase difference between the first input signal and the second input signal may be adjusted, or the first input signal and the second input signal may be supplied while switching each other, so that a plurality of the polarization properties may be implemented. The polarization properties may include a horizontal polarization, a vertical polarization, a right rotation polarization, a left rotation polarization, and the like.

In some embodiments, when the first input signal and the second input signal are simultaneously supplied, the phase difference between the first input signal and the second input signal may be from about 80° to 100°. In this case, the antenna structure may effectively implement the horizontal polarization, the vertical polarization and the circular polarization properties together. Preferably, the phase difference may be from 85° to 95°, more preferably about 90°.

For example, when the phase difference is from about 90° and an axial ratio of the radiator is about 1, the antenna structure may additionally implement the circular polarization (the right rotation polarization and the left rotation polarization) property.

Thus, a plurality of the polarization properties may be implemented through one radiator 122, so that signals of various polarization types may be effectively transmitted and received. Further, a horizontal polarization antenna and a vertical polarization antenna may be integrated, so that a spatial utilization may be improved when the antenna is disposed in a display device, etc.

In some embodiments, the phase difference between the first input signal and the second input signal may be controlled by adjusting lengths of the first transmission line 123 and the second transmission line 125. For example, as illustrated in FIG. 7, the lengths of the first transmission line 123 and the second transmission line 125 may be adjusted to be substantially the same. As illustrated in FIG. 9, the first transmission line 123 and the length of the second transmission line 125 may be adjusted to be different from each other.

For example, if the lengths of the first transmission line 123 and the second transmission line 125 are substantially the same, the input signals having the predetermined phase difference values may be supplied to the first signal pad 153 and the second signal pad 157 from the driving integrated circuit chip while maintaining the phase difference. Accordingly, accurate adjustment of the phase difference between the first input signal and the second input signal may be facilitated.

Figure 10:
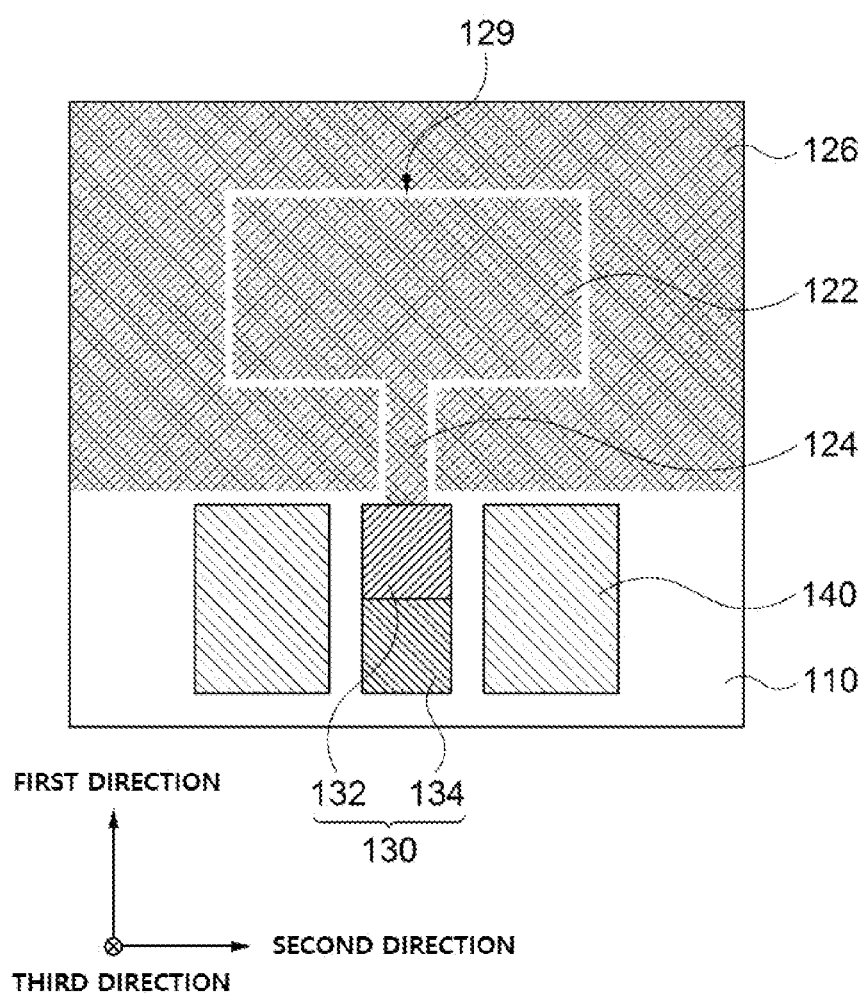

Referring to FIG. 10, if the radiator 122 includes a mesh structure, a dummy mesh pattern 126 may be disposed around the radiator 122. As described with reference to FIG. 1, the radiator 122 may include the mesh structure, so that transmittance of the antenna device 100 or the antenna structure may be improved.

The dummy mesh pattern 126 may be disposed around the radiator 122, so that an electrode arrangement around the radiator 122 may become uniform or averaged.

Accordingly, a visual recognition of the mesh structure or electrode lines included therein may be prevented to a user of the display device.

For example, a metal layer may be formed on the dielectric layer 110, and the mesh structure may be formed while the metal layer may be etched along a predetermined separation region 129 to electrically and physically separate the dummy mesh pattern 126 from the radiation pattern 122 and the transmission line 124.

As illustrated in FIG. 10, if the transmission line 124 also includes the mesh structure, the dummy mesh pattern 126 may also extend around the transmission line 124. In an embodiment, the signal pad 130 and/or the ground pad 140 may also include the mesh structure. In this case, the dummy mesh pattern 126 may be extended around the signal pad 130 and/or the ground pad 140.

Figure 11:
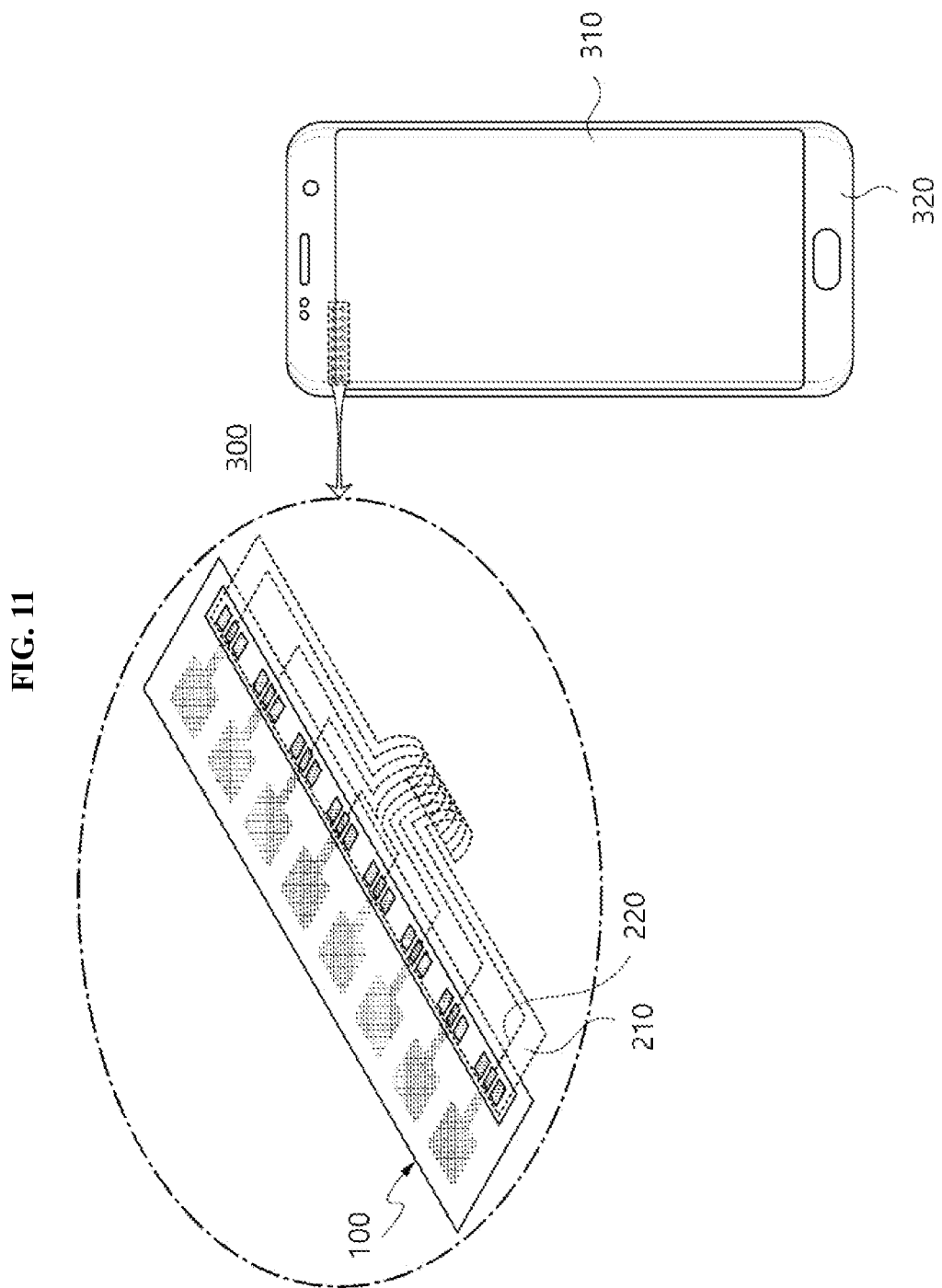
FIG. 11 is a schematic top planar view illustrating a display device in accordance with exemplary embodiments.

FIG. 11 is a schematic top planar view illustrating a display device in accordance with exemplary embodiments. For example, FIG. 11 shows an external shape including a window of a display device.

Referring to FIG. 11, a display device 300 may include a display area 310 and a peripheral area 320. The peripheral area 320 may be disposed at both lateral portions and/or both end portions of the display area 310.

In some embodiments, the antenna device 100 included in the above-described antenna structure may be inserted into the peripheral area 320 of the display device 300 in the form of a patch. In some embodiments, the signal pad 130 and the ground pad 140 of the antenna device 100 may be disposed to correspond to the peripheral area 320 of the display device 300.

The peripheral area 320 may correspond to, e.g., a light-shielding part or a bezel portion of the image display device. In exemplary embodiments, the flexible circuit board 200 of the antenna structure may be disposed in the peripheral area 320 to prevent an image degradation in the display area 310 of the display device 300.

The flexible circuit board 200 and/or the driving IC chip 280 may be disposed together in the peripheral area 320. The pads 130 and 135 of the antenna device 100 may be disposed to be adjacent to the flexible circuit board 200 and the driving IC chip 280 in the peripheral area 320, so that the signal transmission/reception path may be shortened and the signal loss may be suppressed.

The radiator 122 of the antenna device 100 may be at least partially disposed in the display area 310. For example, as illustrated in FIG. 10, the visual recognition of the radiator 122 to the user may be prevented by using the mesh structure.

Hereinafter, preferred embodiments are proposed to more concretely describe the present invention. However, the following examples are only given for illustrating the present invention and those skilled in the related art will obviously understand that various alterations and modifications are possible within the scope and spirit of the present invention. Such alterations and modifications are duly included in the appended claims.

Experimental Example: Measurement of Maximum Gain while Changing Length and Area of Margin Region An antenna unit including a copper-calcium (CuCa) alloy and having a structure as illustrated in FIG. 7 was formed on a polyimide dielectric layer. Each of the first and second signal pads was formed to have a width of 250 μm. Lengths of the first bonding region included in the first signal pad and the second bonding region included in the second signal pad were each fixed to 500 μm, and the lengths of the margin regions were changed.

An ACF layer was formed on the bonding regions, and the copper feeing wiring of a flexible circuit board was exposed and bonded to the ACF layer. A maximum gain was extracted at about 28.5 GHz frequency and an impedance of 50Ω to the flexible circuit board-signal pad connection structure using a radiation chamber (manufactured by C&G Microwave) while increasing the length of the margin region where the ACF layer does not contact. The simulation results were obtained as a graph shown in FIG. 12.

Figure 12:
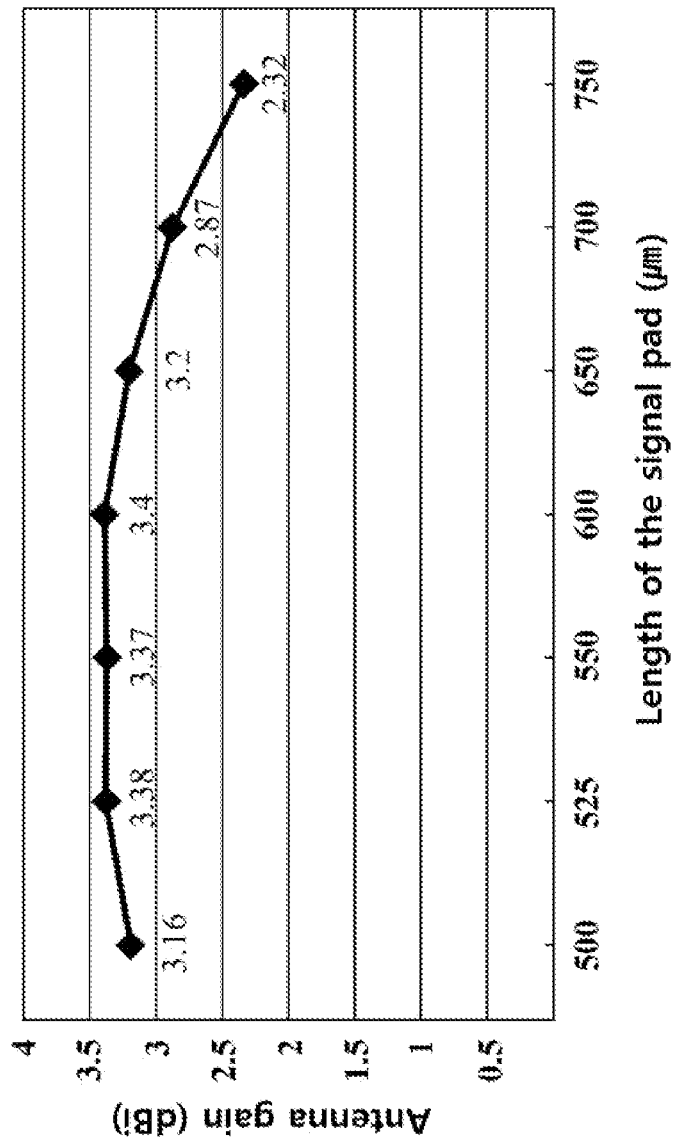
FIG. 12 is a graph showing a change of an S-parameter and a gain amount according to a variation of a margin region length in an antenna structure in accordance with exemplary embodiments.

Referring to FIG. 12, as the length of the margin region increased (an area ratio of the margin region increased), the maximum antenna gain decreased. Specifically, the antenna gain decreased from the length of the signal pad was about 650 μm (length of the margin region: 150 μm, area ratio of the margin region to the bonding region: 0.3). When the length of the signal pad exceeded about 750 μm (length of the margin region: 250 μm, area ratio of the margin region to the bonding region: 0.5) such that the area ratio exceeded about 0.5, the reduction of the antenna gain was explicitly detected. Further, when the length of the signal pad was less than about 750 μm (length of the margin region: 25 μm, area ratio of the margin region to the bonding region: 0.05), the antenna gain was decreased and a radiation efficiency was degraded.

What is claimed is:

1. An antenna structure, comprising:
a dielectric layer;
a radiator disposed on the dielectric layer;
a transmission line branching from the radiator;
a signal pad electrically connected to the radiator through the transmission line on the dielectric layer; and an external circuit structure bonded to the signal pad,
wherein the signal pad includes a bonding region that is bonded to the external circuit structure and a margin region that is not bonded to the external circuit structure and is adjacent to the bonding region; and
an area ratio of the margin region relative to the bonding region in the signal pad is 0.05 or more and less than 0.5.

2. The antenna structure of claim 1, wherein the external circuit structure comprises a flexible circuit board that includes a feeding wiring, and a conductive intermediate structure; and
the conductive intermediate structure is attached on the bonding region of the signal pad, and the feeding wiring of the flexible circuit board is electrically connected to the signal pad through the conductive intermediate structure.

3. The antenna structure of claim 2, wherein the margin region does not directly contact the conductive intermediate structure.

4. The antenna structure of claim 2, further comprising a driving integrated circuit chip electrically connected to the flexible circuit board to supply a power to the radiator through the feeding wiring.

5. The antenna structure of claim 4, wherein the radiator is driven at a frequency from 20 GHz to 40 GHz, and a power corresponding to a range of 40Ω to 70Ω is supplied to the radiator through the driving integrated circuit chip.

6. The antenna structure of claim 1, wherein the area ratio of the margin region relative to the bonding region in the signal pad is from 0.1 to 0.3.

7. The antenna structure of claim 1, further comprising a pair of ground pads spaced apart from the signal pad on the dielectric layer with the signal pad interposed therebetween.

8. The antenna structure of claim 7, wherein each of the pair of the ground pads includes a ground bonding region bonded to the external circuit structure, and a ground margin region that is not bonded to the external circuit structure and is adjacent to the ground bonding region.

9. The antenna structure of claim 8, wherein an area ratio of the ground margin region relative to the ground bonding region is the same as the area ratio of the margin region to the bonding region in the signal pad.

10. The antenna structure of claim 1, wherein the bonding region of the signal pad is directly connected to the transmission line.

11. The antenna structure of claim 1, wherein the margin area of the signal pad is directly connected to the transmission line.

12. The antenna structure of claim 1, wherein the margin region has a width greater than a width of the bonding region.

13. The antenna structure of claim 1, wherein the margin region comprises:
a first portion extending in a length direction to be in contact with the bonding region; and
a second portion extending in a width direction from an end of the first portion.

14. The antenna structure of claim 1, wherein the transmission line comprises a first transmission line and a second transmission line extending in different directions from the radiator; and
the signal pad comprises a first signal pad and a second signal pad electrically connected to the radiator through the first transmission line and the second transmission line, respectively.

15. The antenna structure of claim 14, wherein the first signal pad includes a first bonding region that is bonded to the external circuit structure and a first margin region that is not bonded to the external circuit structure and is adjacent to the first bonding region, and an area ratio of the first margin region relative to the first bonding region in the first signal pad is 0.05 or more and less than 0.5; and
the second signal pad includes a second bonding region that is bonded to the external circuit structure and a second margin region that is not bonded to the external circuit structure and is adjacent to the second bonding region, and an area ratio of the second margin region relative to the second bonding region in the second signal pad is 0.05 or more and less than 0.5.

16. The antenna structure of claim 15, wherein the area ratio of the first margin region relative to the first bonding region is the same as the area ratio of the second margin region relative to the second bonding region.

17. The antenna structure of claim 14, wherein the first transmission line and the second transmission line are symmetrical to each other with respect to a central line of the radiator.

18. A display device comprising the antenna structure of claim 1.

* * * * *